United States Patent [19]
Kelleher et al.

[11] Patent Number: 5,459,103
[45] Date of Patent: Oct. 17, 1995

[54] METHOD OF FORMING LEAD FRAME WITH STRENGTHENED ENCAPSULATION ADHESION

[75] Inventors: Harold T. Kelleher, Attleboro; David W. West, Pembroke, both of Mass.

[73] Assignee: Texas Instruments Incorporated, Dallas, Tex.

[21] Appl. No.: 228,996

[22] Filed: Apr. 18, 1994

[51] Int. Cl.⁶ .................................................. H01L 21/60
[52] U.S. Cl. ..................... 437/209; 437/211; 437/220; 257/666; 257/667; 257/734; 257/735; 257/736; 257/780; 257/781
[58] Field of Search ................................... 437/209, 210, 437/211, 220; 257/666, 667, 734, 735, 736, 772, 787, 780, 781

[56] References Cited

U.S. PATENT DOCUMENTS

| | | | |
|---|---|---|---|
| 3,979,623 | 9/1976 | Yanagisawa et al. | 313/190 |
| 4,255,851 | 3/1981 | Fortuna | 29/827 |
| 4,480,261 | 10/1984 | Hattori et al. | 257/772 |
| 4,486,945 | 12/1984 | Aigoo | 437/210 |
| 4,707,724 | 11/1987 | Suzuki et al. | 357/71 |
| 4,800,178 | 1/1989 | Mathew et al. | 437/210 |
| 4,801,488 | 1/1989 | Smith | 428/209 |
| 4,868,635 | 9/1989 | Frechette et al. | |
| 4,908,086 | 3/1990 | Goodrich et al. | 437/210 |
| 5,013,683 | 5/1991 | Yamazaki et al. | 437/210 |
| 5,087,590 | 2/1992 | Fujimoto et al. | 437/210 |
| 5,196,268 | 3/1993 | Fritz | |
| 5,328,811 | 7/1994 | Brestel | 430/325 |
| 5,329,158 | 7/1994 | Lin | 257/666 |

FOREIGN PATENT DOCUMENTS

| | | | |
|---|---|---|---|
| 0335608A2 | 10/1989 | European Pat. Off. | |
| 5067155 | 5/1980 | Japan | 257/736 |

OTHER PUBLICATIONS

Abstract–*Pop–Corn Package Inegrity Without "Pix–On–Pad"* by Lin Thim Bang, Shim Kwee Choy, Teo Boon Ching (Mar. 1993).

Technical Data Sheet–*Ebonol® C and Ebonol® C Special For Blackening And Coloring Brass, Copper and Copper Alloys,* by Enthone–OMI, Inc. (1991).

Technical Data Sheet–*Ebonal® C For Blackening And Coloring Copper and Copper Alloys,* by Enthone–OMI, Inc. (undated).

Technical Data Sheet–*Brass Activator,* by Enthone–OMI, Inc. (undated).

Technical Data Sheet–*Black Oxide Finish For Copper, Brass and Bronze,* by Electrochemical Products, Inc. (Jul. 1989).

Technical Data Sheet–*Room Temperature For Brass, Bronze, Copper, Nickel, Pewter and Silver,* by Electrochemical Products, Inc. (Jul. 1990).

*Primary Examiner*—Olik Chaudhuri
*Assistant Examiner*—Long Pham
*Attorney, Agent, or Firm*—Robby T. Holland; Wade James Brady, II; Richard L. Donaldson

[57] ABSTRACT

This invention relates to a process for strengthening the adhesive bond between a lead frame and a plastic mold compound (350). The process involves plating the lead frame with a copper strike and selectively exposing the copper strike to an oxidizing agent to form a layer of cupric oxide (CuO) (318). Such lead frames are fitted with chips (324) and then encapsulated in the plastic mold compound (350), whereby the adhesive bond forms directly between the layer of CuO (318) and the plastic mold compound (350). A lead frame produced by this process may include a plurality of leads (310) having lead ends (312) and lead fingers (314) and a die pad (320) having a layer of CuO (318). The die pad (320) is encased by a plastic mold compound (350) which forms an adhesive bond directly with the layer of CuO (318). This layer (318) may have a thickness in a range of about 5 to 50μ inches (12.7 to 127 μcm). Lead ends (312) and lead fingers (314) may be spot-plated with silver or palladium.

2 Claims, 5 Drawing Sheets

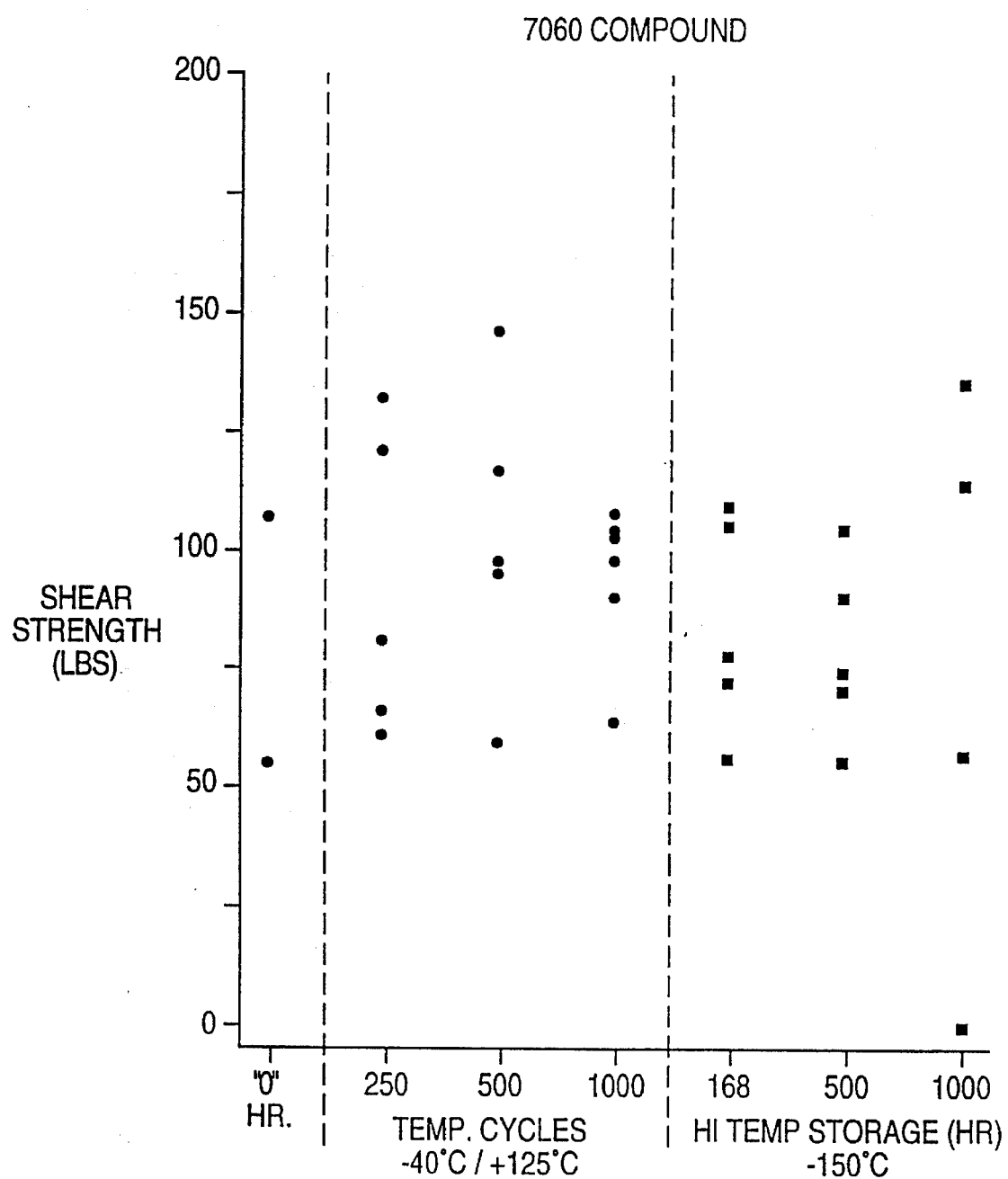

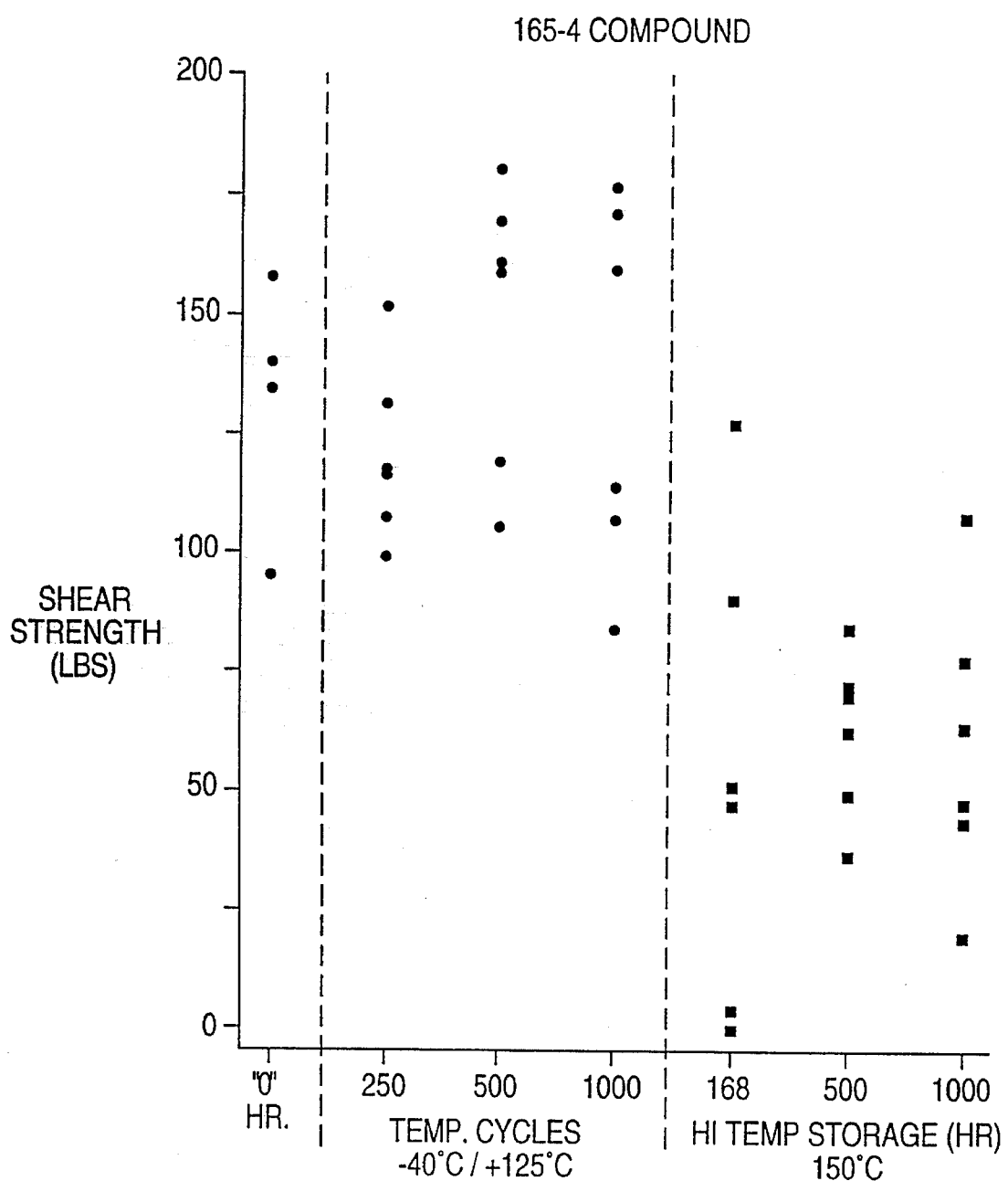

5,459,103

METHOD OF FORMING LEAD FRAME WITH STRENGTHENED ENCAPSULATION ADHESION

TECHNICAL FIELD OF THE INVENTION

This invention relates in general to packaging of semiconductor integrated circuit (IC) devices and more particularly, to a process for treating lead frames to achieve strengthened encapsulation adhesion and to lead frames produced by this process.

BACKGROUND OF THE INVENTION

Lead frames are usually manufactured in long strips of many individual units. The long strips may be wide enough to accommodate from one to five lead frames. A lead frame may be equipped with carrier rails and guide holes to position the lead frames during manufacture. The lead frames may be comprised of a plurality of leads having lead ends and lead fingers, tie bars, and a die pad. The die pad is centrally located on the lead frame and provides the area on which a semiconductor chip may be mounted. When a strip is more than one lead frame wide, the strip is referred to as a matrix.

Most IC devices are assembled around a lead frame. Conventional lead frame plating processes produce lead frames with clean, non-reactive finishes of silver, palladium, nickel, or copper. The die pad of such a lead frame is downset during packaging and a chip, such as a silicon wafer or a semiconductor chip, is affixed to the die pad. Connection areas on the chip, e.g., bond pads, are connected to the lead frame's lead fingers by wire bonds. Excess lead frame material, such as the carrier rails, may then be trimmed away and the die pad, chip, leads, and associated connections are encapsulated in a plastic mold compound.

A source of failure in semiconductor IC packages is the delamination of the plastic mold compound from the lead frame. This may result from various causes including improper curing of the plastic mold compound and "popcorn failure." Popcorn failure may occur when liquids, such as water, are trapped beneath the encapsulation during packaging of the semiconductor devices or when liquids seep or vapors condense under the plastic mold. Moreover, plastic mold compounds are naturally capable of absorbing liquids from their environment until saturation occurs. Such liquids may be vaporized during semiconductor IC operation, and the expanding vapor, e.g., steam, may cause pressure to build up beneath the encapsulation. This pressure build up may cause a catastrophic mold failure.

Encapsulation failure may also result from thermal mismatch between dissimilar device materials, such as between the chip and the die pad, at solder reflow temperatures, e.g., temperatures in a range of about 419° to 464° F. (215° to 240° C.). Such mismatches may be aggravated by the pressure created by the heating of liquids absorbed by the plastic mold compound. The combined effect of these stresses degrades adhesion, leads to delamination—especially between the underside of the die pad and the plastic mold compound, and may cause encapsulation cracking or failure.

Efforts to resolve these problems have involved choosing and developing plastic mold compounds that improve adhesion between the die pad and the plastic mold compound. Encapsulations that are lower stress, stronger, absorb less moisture, and possess better adhesion capabilities have been proposed. Nevertheless, these have not eliminated the problems. Further, because specialized encapsulations are generally more expensive, their use tends to increase the costs of manufacturing.

SUMMARY OF THE INVENTION

Accordingly, a need has arisen for a lead frame which may be used to package semiconductor IC devices which achieves strengthened adhesion between the lead frame and plastic mold compounds. A need also has arisen for a process by which the mold adhesion between the plastic mold compound and the lead frame may be strengthened and which can be employed to produce such lead frames in economical quantities and at commercial rates. In accordance with the present invention, a surface treatment is performed on the lead frame to strengthen the adhesion between the lead frame and the plastic mold compound. This treatment substantially reduces the likelihood of delamination failures, e.g., popcorn failures, in semiconductor IC devices.

An embodiment of the present invention is a process for achieving a strengthened adhesive bond between the surface of a copper lead frame and a plastic mold compound, which includes the step of selectively exposing the lead frame to an oxidizing agent, i.e, a compound which readily gives up oxygen, to form a layer of cupric oxide (CuO). Portions of the lead frame may then be encapsulated in the plastic mold compound, whereby the adhesive bond forms directly between the layer of CuO and the plastic mold compound. In another embodiment, the invention is a process for achieving a strengthened adhesive bond between the surface of a lead frame and a plastic mold compound which includes the steps of plating the lead frame with a copper strike and selectively exposing the lead frame to an oxidizing agent to form a layer of CuO. The lead frame may then be selectively plated with a highly conductive metal, such as silver, gold, or palladium. Again, portions of the lead frame may be encapsulated in the plastic mold compound, whereby the adhesive bond forms directly between the layer of CuO and the plastic mold compound.

Consistent with the embodiments of the process described above, the present invention also relates to a lead frame including a die pad having a layer of CuO. A plastic mold compound may encapsulate the die pad and form an adhesive bond directly with the layer of CuO.

The present invention provides various technical advantages over known lead frames and lead frame manufacturing processes. For example, a technical advantage is that lead frames with a layer of CuO according to this invention may be rapidly produced in large quantities in association with reel-to-reel or batch plating processes. Another technical advantage is that the selective exposure of the lead frame to an oxidizing agent to produce a layer of CuO may be performed with a mechanical mask or using a patterned photoresist treatment. If a photoresist is used, it may subsequently be removed using a caustic bath. Moreover, such a photoresist may be used to cover areas that may subsequently be plated with a precious metal, such as silver, gold, or palladium. Yet another technical advantage is that a selectively plated copper strike may also be used to enhance the uniformity of the layer of CuO and thereby, further strengthen adhesion between the plastic mold compound and the treated lead frame surfaces.

Other technical advantages are readily apparent to one skilled in the art from the following drawings, descriptions,

BRIEF DESCRIPTION OF THE DRAWINGS

For a more complete understanding of the present invention and the technical advantages thereof, reference is made to the following description taken in conjunction with accompanying drawings, in which:

FIG. 4a is a graphic depiction of the shear strength of the adhesive bond between a plastic mold compound and a treated lead frame, as presented in Table I.

FIG. 4b is a graphic depiction of data describing the shear strength of the adhesive bond between a plastic mold compound and a treated lead frame, as presented in Table II.

DETAILED DESCRIPTION OF THE INVENTION

Figure 1:
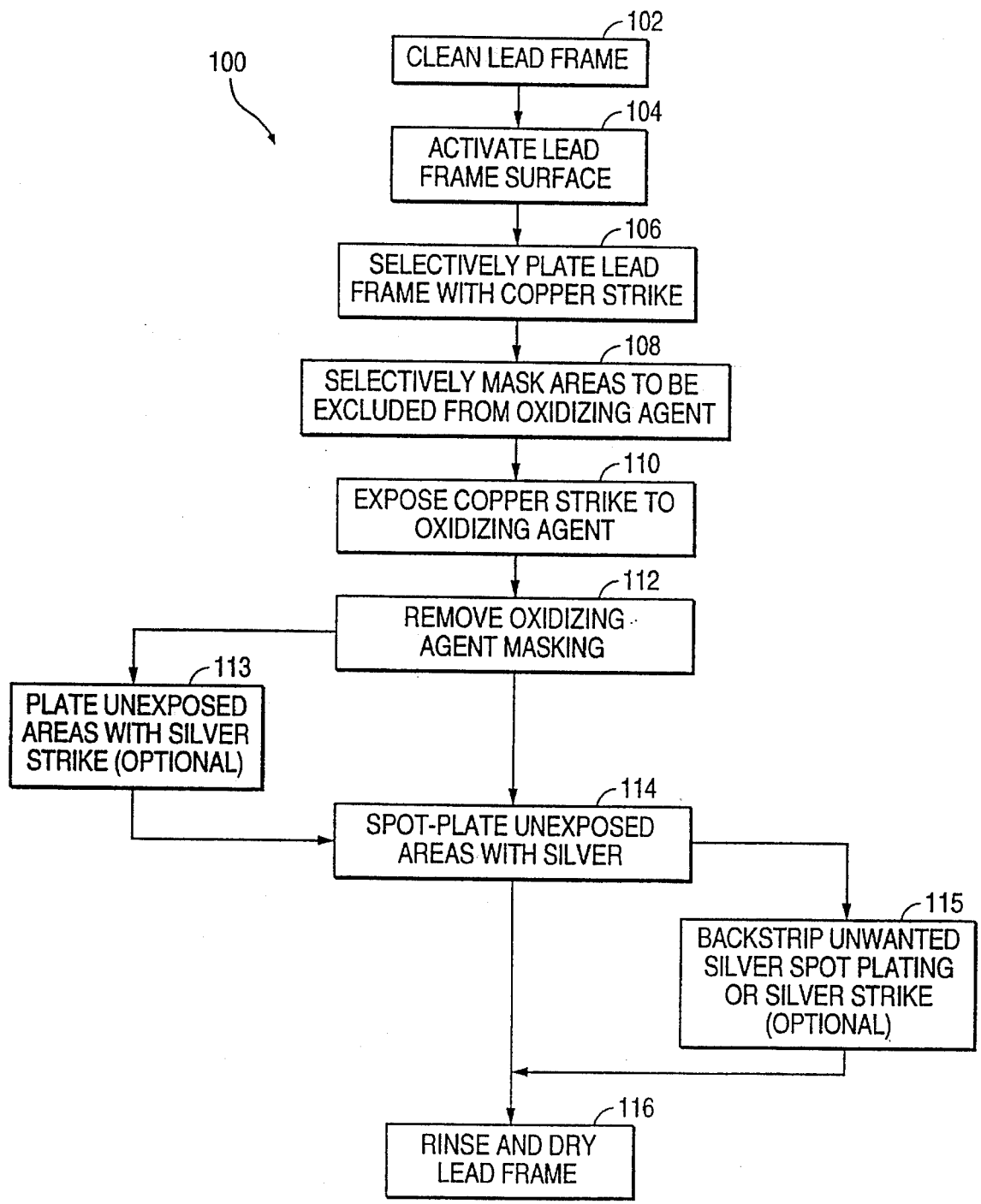
FIG. 1 is a flow chart depicting an embodiment of the process of this invention.

Referring to FIG. 1, a flow chart depicting an embodiment 100 of the process of the invention is shown. In this process, a lead frame is first cleaned, step 102. This may be accomplished by using electrolytic cleaners, alkaline cleaners, or ultrasonic cleaners, or a combination of these. If the lead frame is stamped, oil may be deposited on the lead frame by the stamp apparatus. If the lead frame is etched, excess photoresist may remain on the lead frame after etching. Such oil or excess photoresist is removed during cleaning.

Electrolytic cleaning may be accomplished in at least two ways. First, lead frames may be drawn through a fluid bath in which they are exposed to positive and negative electrodes submersed in the bath. Dirt and manufacturing residue, such as oil and photoresist, which may be clinging to the lead frame, transfer to the negative electrode. Alternatively, a plurality of negative electrodes may be submersed in the bath and a positive charge may be applied to the lead frame. Again, dirt and residue clinging to the lead frame transfer to the negative electrodes. The bath may include alkaline cleaners, i.e., an aqueous solution of a compound having a PH greater than 7 for cleaning metals, such as Peptizoid 143SP/UDYPREP. After cleaning, the surface of the lead frame is chemically activated to ensure more complete and rapid plating, step 104. This may be accomplished by exposing the lead frame in an acid bath.

After the surface of the lead frame has been activated, a copper strike may be flood or selectively plated to the lead frame, step 105. Lead frames may be made from a metal selected from a group consisting of copper, nickel, silver, gold, palladium, Alloy 42, and aluminum. Alloy 42 is an metal alloy including about 42% nickel and about 58% iron by weight. Process 100 may be used with either copper or non-copper lead flames. Thus, a copper strike may be plated to either surface of a copper or noncopper lead frame, and the copper strike may be plated selectively to the lead frame by means of (1) mechanical masking of the lead frame, (2) photoresist-type masking, or (3) ring plating. Copper lead flames include lead flames made from copper or copper alloys. A copper strike is a thin, uniform layer of pure copper that is plated, e.g., electroplated, to the surface of the lead frame. By plating the lead frame with a copper strike, the lead frame acquires a uniform reactive surface which facilitates subsequent plating and the creation of a uniform layer of CuO.

The lead frame may be selectively masked before it is treated with an oxidizing agent, step 108. The lead frame may then be treated with the oxidizing agent in order to oxidize the exposed copper or copper strike surfaces to form a thin, uniform layer of CuO, step 110. Various oxidizing agents for blackening copper may be used in this process. For example, Ebonol®-C and Ebonol®-C Special are produced by Enthone-OMI, Inc. and contain sodium chlorite ($NAClO_2$) and sodium hydroxide (NaOH). Both products are strong oxidizing agents used to blacken copper. An oxidizing agent bath may have a concentration of about one pound of Ebonol®-C per gallon of water (0.12 kg./l.). When oxidizing lead frames with Ebonol®-C, the lead frames are placed in a bath containing Ebonol®-C at a temperature in the range of about 190° to 210° F. (88° to 99° C.), e.g., about 200° F. (93° C.). The lead frames may be exposed to the Ebonol®-C bath for a period in a range of about 15 seconds to 10 minutes, e.g., about 1 minute. This exposure to Ebonol®-C results in a CuO thickness in a range of about 5 to 50μ inches (12.7 to 127 μcm), e.g., a thickness of about 10μ inches (25.4 μcm). Other oxidizing agents suitable for blackening copper lead frames or lead frames plated with a copper strike are produced by Electrochemical Products Inc. (EPI). For example, the 300 series of B/OX produced by EPI may be used for oxidizing copper or surfaces plated with copper. Further, EPI's C/OX 420 oxidizing salts are dry, free flowing powered mixtures which may be dissolved in water in a concentration of about 2 pounds of C/OX 420 salts per gallon of water (0.24 kg./l.) to form an oxidizing bath.

Figure 2:
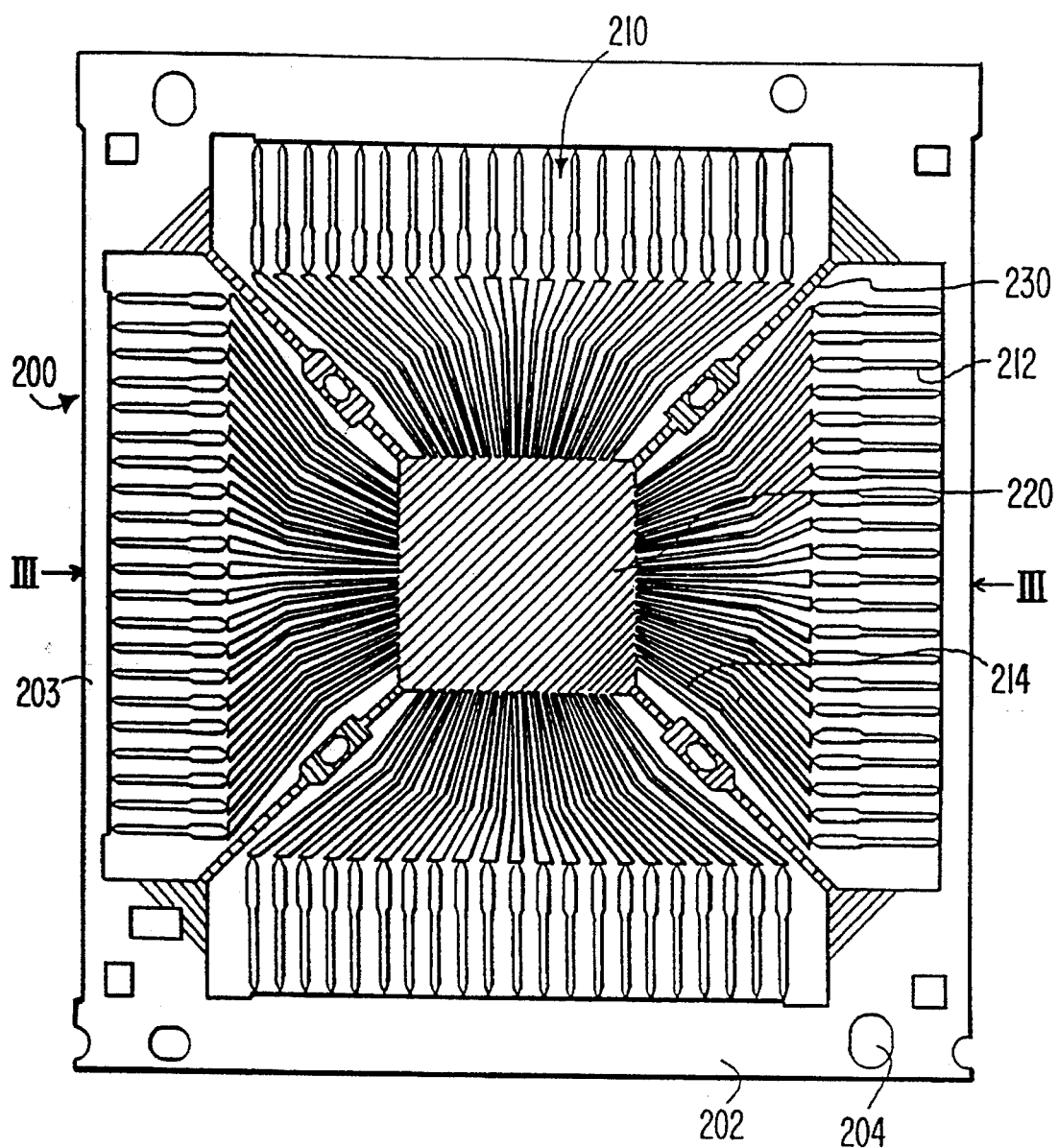
FIG. 2 depicts an overhead view of a lead frame with attached carrier rails after treatment with an oxidizing agent.

In the packaging of semiconductor IC devices, lead ends and lead fingers of the lead frame may be spot-plated or strike-plated with a highly conductive metal including a precious metal, such as silver, gold, or palladium, in order to increase the conductivity of connections between a chip and the lead fingers or between the lead ends of IC devices. Referring to FIG. 2, a single lead frame 200 is shown which includes leads 210, a die pad 220, and tie straps 230. Leads 210 may be stamped or etched from a strip of lead frame material, such as copper, and have lead ends 212 and lead fingers 214. Lead frames, such as lead frame 200, may be manufactured in long strips in a reel-to-reel or batch plating process.

Each lead frame 200 may be attached to at least one carrier rail 202, and separated from each adjacent lead frame 200 by a separating strip 203. After plating and surface treatments are completed, carrier rail(s) 202 and separating strip(s) 203 are trimmed from lead frame 200. Further, carrier rail(s) 202 may have at least one guide hole 204, so that lead frame 200 may be positioned during manufacture, e.g., during plating or treatment with an oxidizing agent. At least one guide hole 204 is especially useful in the accurate application of mechanical or photoresist masking or selective silver plating.

Figure 3:
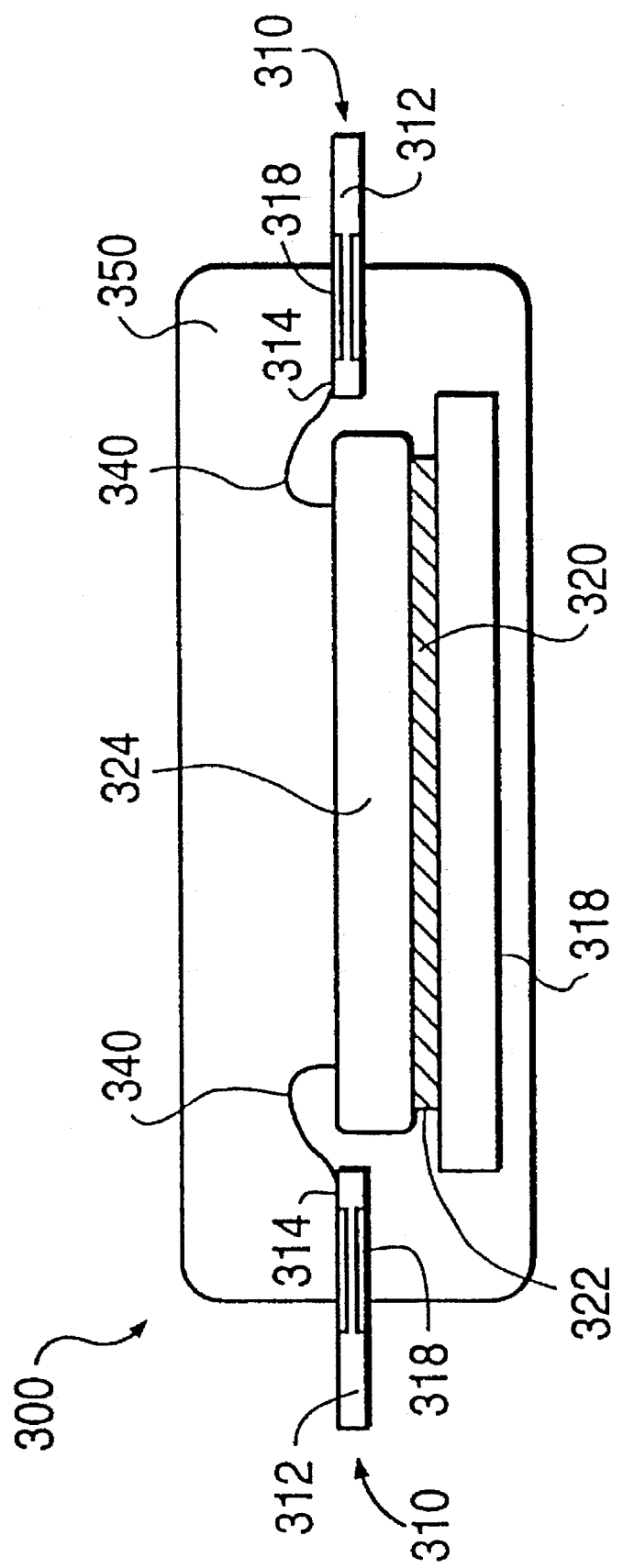
FIG. 3 depicts a cross-sectional view of a semiconductor IC device with the lead frame of FIG. 2, along line III—III, encapsulated in a plastic mold compound.

Referring to FIG. 3, a cross-sectional view of a semiconductor IC device 300 is shown which includes leads 310 and a die pad 320. Leads 310 have lead ends 312 and lead fingers 314. Lead ends 312 and lead fingers 314 are not exposed to the oxidizing agent, because a layer of CuO might denigrate the connections between leads 310 and the chip 324. Leads 310 and die pad 320 have a thin layer of CuO 318 selectively formed on their surfaces. Chip 324 is affixed to die pad 320 by an epoxy 322. Bond pads (not shown) on chip 324 are connected by wire bonds 340 to lead fingers 314. Die pad 320, chip 324, wire bonds 340, and portions of leads 310 are then encapsulated in plastic mold compound 350. According to this invention, the adhesive bond between leads 310 and die pad 320 and plastic mold compound 350 is strengthened by the layer of CuO 318 which is created by selectively exposing the lead frame to an oxidizing agent. Thus, a strengthened adhesive bond forms directly between layer 318 and plastic mold compound 350.

A silver plating may be applied to a copper lead frame or a lead frame plated with copper strike by at least two methods, step 114. First, the silver may be selectively plated to the copper or copper strike lead ends or lead fingers before the lead frame is exposed to the oxidizing agent. Second, a photoresist may be applied to the lead frame. The photoresist is applied to the lead frame according to a pattern defining areas that are subsequently to be silver plated. The photoresist is then exposed and developed. After the photoresist has been developed, the unexposed photoresist is washed away and, the lead frame may be exposed to the oxidizing agent. The exposed photoresist is then dissolved leaving a lead frame with a layer of CuO on the copper or copper strike surfaces and untreated surfaces for silver plating, step 112.

After selective areas of the lead frame have been treated with an oxidizing agent, the untreated surfaces of the lead frame may be plated with a silver strike or may be spot-plated with silver, steps 113 through 115. If silver plating is used, the lead frame later may be backstripped, step 115. Backstripping may be accomplished by submersing the lead frame in a backstrip solution and applying a positive charge to the lead frame. The backstrip solution may include compounds which encourage the removal of the silver, or other plating metal. For example, a solution containing about 4 to 8 oz./gal. (0.03 to 0.06 kg./e.) of MECOSTRIP® backstrip solution, manufactured by MECO Equipment USA, Inc., or about 0.14 to 1.4 oz./gal (0.001 to 0.01 kg./l.) of potassium hydroxide (KOH) may be used. A negative stainless steel electrode is also submerged in the backstrip solution, and silver plating stripped from the lead frame transfers to the stainless steel plate.

Once the lead frame has been exposed to an oxidizing agent and plated, the lead frame is rinsed. The lead flames may be rinsed between each process step to reduce dragout, i.e., the carryover of bath contents from one step to subsequent steps. When silver plating is complete, the lead frame may be given a final rinse and dried, step 116. The rinsing and drying processes remove harmful residue, such as chlorine residue remaining after oxidation with an agent containing sodium chlorite, from the lead frame. The lead frame may be dried by passing it under a blower providing warm, dry air at the reel-to-reel or batch processing rate, e.g., a rate of about 10 to 40 ft./min. (3.1 to 12.2 m./min.).

If palladium is plated to the lead frame, the palladium plating may be performed before or after the lead frame has been exposed to the oxidizing agent. If palladium is plated to the lead frame, a slightly different process from silver plating is used. For example, the areas of the lead frame which are to be exposed to the oxidizing agent may be masked mechanically or with a photoresist before the palladium plating. For example, a copper lead frame may be cleaned and chemically activated in the manner described above; however, nickel is then plated to the lead frame. As mentioned above, a copper strike may be plated to the copper lead frame to provide a uniform reactive surface for the nickel plate. After the lead frame has been nickel plated, a palladium/nickel (Pd/Ni) strike is plated to the lead frame. A second nickel plate is then applied to the Pd/Ni strike, and the lead frame is reactivated using an acid bath. This "double" nickel plated lead frame is then plated with palladium.

In a palladium plating process, the first nickel plate may have a thickness greater than about 5μ inches (12.7 μcm). The Pd/Ni strike may have a thickness of less than about 2μ inches (5.1 μcm). The second nickel plate is thicker than both of the previous layers and may have a significantly greater thickness in a range of about 40 to 60μ inches (101.6 to 152.4 μcm). Finally, the palladium plate may have a thickness in the range of about 1 to 10μ inches (2.5 to 25.4 μcm). A suitable palladium plating may have a thickness of about 3μ inches (7.62 μcm).

Tables I and II show the shear strengths obtained when two plastic mold compounds were molded to a copper heat spreader which had been exposed to an oxidizing agent. In both tables, the heat spreader had been plated with a copper strike, and the oxidizing agent used to treat the copper strike was a bath containing Ebonol®-C within the concentration range described above. Each table depicts shear strengths measured after periods of normal environmental exposure over a temperature range between about −40° to 257° F. (−40° to 125° C.) and after periods of high temperature storage at temperatures in excess of about 302° F. (150° C.).

Table I shows the shear strengths obtained after the 7060 plastic mold compound produced by Plaskon, Inc., was molded to the exposed copper heat spreader. Referring to FIG. 4a, the shear strength of this plastic mold compound adhesion to the copper heat spreader treated with the process of this invention averaged about 92.8 lbs (42.2 kgs) after normal environmental exposure. After periods of high temperature storage, the average observed shear strengths for the plastic encapsulated copper spreader declined to about 79.5 lbs (36.1 kgs).

TABLE I

| | PLASTIC MOLD COMPOUND: 7060 COMPOUND | | | | | | |
|---|---|---|---|---|---|---|---|
| | Environmental Exposure (Hours) | | | | | | |
| | (TEMP RANGE −40° C./+125° C.) | | | | (HIGH TEMP STORAGE 150° C.) | | |
| | 0 HR | 250 HR | 500 HR | 1000 HR | 168 HR | 500 HR | 1000 HR |
| Shear | 55 | 61 | 95 | 98 | 105 | 104 | 56 |
| Strength | 107 | 121 | 116 | 103 | 72 | 74 | 0 |
| (Pounds) | — | 81 | 97 | 108 | 78 | 55 | 135 |
| | — | 132 | 146 | 64 | 109 | 70 | 113 |
| | — | 66 | 59 | 103 | 56 | 90 | — |
| Average | 81 | 92.2 | 102.6 | 95.2 | 84.0 | 78.6 | 76.0 |
| Std. Dev. | 36.8 | 32.4 | 31.8 | 17.9 | 22.5 | 18.9 | 60.6 |

Similarly, Table II shows the shear strengths obtained after the 165-4 plastic mold compound produced by Schnitzu Company was molded to the exposed copper heat spreader. Referring to FIG. 4b, the average shear strength of the plastic mold compound adhesion to the copper heat spreader treated with the process of this invention averaged about 132.9 lbs (60.4 kgs) after periods of normal environmental exposure. After periods of high temperature storage, however, the average shear strengths also declined to about 58.1 lbs (26.4 kgs).

Conventional palladium plated lead frames encapsulated in a plastic mold compound, such as either the 7060 plastic mold compound or the 165-4 plastic mold compound, have a sheer strength of about 10 lbs (4.5 kgs). Thus, multiple factor strength increases are achieved for palladium plated lead frames manufactured by this process.

TABLE II

PLASTIC MOLD COMPOUND: 165-4 COMPOUND

Environmental Exposure (Hours)

| | (TEMP RANGE −40° C./+125° C.) | | | | (HIGH TEMP STORAGE 150° C.) | | |
|---|---|---|---|---|---|---|---|
| | 0 HR | 250 HR | 500 HR | 1000 HR | 168 HR | 500 HR | 1000 HR |
| Shear | 140 | 118 | 105 | 84 | 0 | 62 | 107 |
| Strength | 95 | 181 | 101 | 107 | 51 | 84 | 48 |
| (Pounds) | 156 | 152 | 119 | 114 | 4 | 72 | 63 |
| | 134 | 196 | 161 | 177 | 47 | 70 | 1 |
| | — | 117 | 159 | 172 | 90 | 36 | 77 |
| | — | 99 | 170 | 160 | 127 | 49 | 47 |
| Average | 131.3 | 120.5 | 144.2 | 135.7 | 53.2 | 62.2 | 59.0 |
| Std. Dev. | 25.9 | 18.9 | 30.1 | 38.9 | 49.2 | 17.3 | 32.0 |

Although a detailed description of the present invention has been provided above, it is to be understood that the scope of the invention is not to be limited thereby, but is to be determined by the claims that follow.

What is claimed is:

1. A process for achieving a strengthened adhesive bond between the surface of a copper lead frame having a plurality of leads and a plastic mold compound, comprising the steps of:

plating said leads with a copper layer;

selectively forming a layer of CuO on the copper layer;

selectively plating said leads with a first layer of nickel;

plating said first layer of nickel with a palladium/nickel layer;

plating said palladium/nickel layer with a second layer of nickel;

activating said second layer of nickel; and plating said second layer of nickel with palladium.

2. A process for achieving a strengthened adhesive bond between the surface of a lead frame and a plastic mold compound the steps of:

plating said leads with a copper layer;

selectively forming a layer of CuO on the copper layer;

selectively plating said lead frame with a first layer of nickel;

plating said first layer of nickel with a palladium/nickel layer;

plating said palladium/nickel layer with a second layer of nickel;

activating said second layer of nickel; and plating said second layer of nickel with palladium.

* * * * *